MULTILAYER LAMINATED WIRING

Original Filed April 21, 1961 2 Sheets-Sheet 1

INVENTORS:
Norman J. Schuster
Carl H. Wolfe
By Alan C. Rose
Attorney

Oct. 3, 1967 N. J. SCHUSTER ET AL 3,344,515

MULTILAYER LAMINATED WIRING

Original Filed April 21, 1961 2 Sheets-Sheet 2

INVENTORS:
Norman J. Schuster
Carl H. Wolfe
By Alan C. Rose
Attorney 3,344,515

MULTILAYER LAMINATED WIRING

Norman J. Schuster, Los Angeles, and Carl H. Wolfe, Santa Monica, Calif., assignors to Litton Systems, Inc., Beverly Hills, Calif.

Original application Apr. 21, 1961, Ser. No. 104,683, now Patent No. 3,219,749, dated Nov. 23, 1965. Divided and this application Aug. 21, 1964, Ser. No. 391,170
4 Claims. (Cl. 29—628)

This invention relates to etched electronic wiring circuits and more particularly to a multilayered wiring laminate and a process for producing such a laminate.

This application is a division of our application Ser. No. 104,683, filed Apr. 21, 1961, now Patent No. 3,219,749.

In the design of modern electronic equipment, the parameters of volume and weight have become extremely important, and new manufacturing techniques have, to a great extent, reduced the size of such individual components as resistors, capacitors, diodes, transistors, transformers, and the like. Other technological advances have resulted in the creation of so-called "micro-circuits," "micro-modules" and "micro-miniature" circuits, all in an attempt to increase the number of components per volumetric unit.

Unfortunately, the technology of interconnection has not kept pace and, as a result, many of the advantages of size reduction of components and elementary circuits are frequently nullified if conventional wiring techniques are required to connect the individual circuits into larger electronic systems. For example, if an individual, monofilament conductor must be used for each electrical signal to be transmitted, the many strands of insulated wire that would be required would, of necessity, result in a bulky and unwieldly cabling harness with associated multicontact connectors.

In the prior art, many attempts have been made to reduce both the size and bulk of the wiring interconnecting individual circuits by such expedients as conductors embedded in a plastic sheet or the use of etched wiring panels. These approaches serve only to transfer the situs of the problem from the individual circuits to a more remote location where bulky, space consuming, wiring harnesses are more easily accommodated and the problem is not really solved. Frequently, these methods may even unnecessarily increase the number of conductors in the system since some signals brought out to terminals must be applied to adjacent terminals for return to a component or circuit which is in close proximity to the signal source. Further, the use of many, relatively long, lengths of conductors tend to increase the effects of stray capacitance and inductance. Moreover, the number of connecting points to which conductors must be soldered are increased, thereby detracting from ultimate system reliability.

Other approaches to the problem have included stacking several individual, etched circuit boards, each carrying a wire pattern. The boards must be relatively thick to provide adequate structural support to the wiring and, as a result, are difficult to align with connecting points in the individual layers in perfect registry. Furthermore, the boards tend to separate under vibration and handling, which exerts undue strain on interboard connections. Furthermore, connecting and removing components becomes an extremely delicate operation because of the danger of excess solder flowing between the boards, or the creating of moisture traps.

Still another development has resulted in a flat cabling in which a plurality of flattened wires are embedded, in parallel, in a thermoplastic sheet. This cabling, which is available in straight lengths, requires extensive jumpering to adapt this type of wiring for anything other than a simple connection between two sets of terminals.

In contrast, however, the present invention provides an interconnecting harness that is relatively compact, flexible, and is well suited to mass production methods. Wiring patterns are etched on separate lamina and the individual laminas or layers are stacked in a predetermined order. Each lamina is perforated to provide access apertures to terminal pads in underlying laminas.

For dimensional stability, a thermosetting plastic material, such as fiberglass cloth which has been impregnated with an epoxy resin, and subsequently cured and clad with copper, is used as the base material of each lamina. A thermosetting film adhesive is applied between adjacent laminas to aid in bonding and the resulting multilayer stack is fused together in a press structure that approximates a compression mold.

Lamination is accomplished under elevated heat and pressure. The stack is suspended or floated between silicone rubber sheets within the compression mold during bonding to impose pressures only in the direction perpendicular to the planar surface of the laminas. Further, the rubber also acts as a male die in the apertured areas to prevent flow of the adhesive into the apertures. Where the apertures extend through several layers, the rubber on the nonapertured side also acts as a male die to bring the terminal pads closer to the opposite surface.

After the layers of the laminate have been bonded into an integral, multilayer sandwich, a smaller hole is drilled or punched through each terminal pad. Each large aperture then exposes a terminal pad to one side of the laminate, and a much smaller hole provides access to the terminal pad from the opposite side. It is then possible to mount individual electronic components directly upon the laminate by inserting wire leads through the smaller apertures. The leads are soldered to the terminal pads from either side of the laminate and solder fillets are formed in the large aperture.

Modular elements comprising complete subcircuits can be mounted upon conventional etched cards which have a plurality of male connecting elements or conducting pins along one edge. The row of pins can be inserted into a plurality of female connecting elements or a corresponding row of holes in the laminate and the pins can then be soldered to the proper terminal pads. If all components are inserted from the unclad or the bottom side (opposite the large apertures), conventional dip soldering techniques may be used, while if soldering each individual connection is preferable, the insertion is made from the apertured, or top side.

In an alternative embodiment of the invention, a laminate is prepared in accordance with the invention but the bottom surface also has a wiring pattern etched thereon. After the step of punching or drilling the smaller apertures is completed, the inner walls of these holes or apertures are plated through to the bottom surface. In this way, terminal pads on different layers are electrically connected by means of the wiring pattern on the bottom surface. This technique permits the preparation of a board with layer-to-layer interconnections and avoids the need for providing separate soldered connections to enable communication between noncoplanar circuits.

According to another alternative embodiment of the invention, the laminated wiring can be used to interconnect components directly as well as to interconnect modules. Here, the etched wiring and terminal pads of the individual lamina are reduced in size and the connection grid determining the pad to pad spacing is also reduced. Furthermore, the laminate can include many layers. In this alternative embodiment, the bottom and top surfaces of the laminate also have etched wiring patterns and a plurality of terminal pads, and the large, access apertures are not used. After lamination, the smaller apertures are then drilled out and all apertures are plated through to connect with pads on the surface layers. Individual components or cards can be inserted from either side and the conductors can easily be soldered to the pads.

For even more complex circuits, a variation of the preceding embodiment has been developed utilizing individual laminas which are clad on both surfaces. These laminas are etched with desired patterns and stacked with separating sheets of board material insulating adjacent surfaces. After lamination, the small apertures are drilled out and these apertures are plated through to the top and bottom surfaces. Components or modules are inserted from either side of the laminate and are soldered into place.

Accordingly, it is an object of the present invention to provide an integral multilayered wiring laminate and a process for producing same.

It is another object of the invention to provide a multilayer etched wiring laminate for interconnecting a plurality of electronic subassemblies.

It is a still further object of the invention to provide a multilayer etched wiring laminate for providing common power conductors and signal conductors to a plurality of electronic modules.

It is yet another object of the invention to provide an integral cabling harness for electrically interconnecting a plurality of electronic circuits to produce an electronic system.

It is a still further object to provide a cabling harness for electrically interconnecting a plurality of component-carrying etched wiring boards.

It is another object to provide a process for producing an integral multilayer etched wiring laminate for electrically interconnecting a plurality of circuit modules and for applying energizing electrical power and signals to said circuit modules.

It is another object to provide a process for producing an integral multilayer etched wiring laminate for electrically interconnecting a plurality of circuit components and for applying energizing electrical power and signals to said circuit components.

It is yet another object to provide a process for laminating a plurality of thermosetting laminas, each having a wiring pattern etched thereon, into an integral multilayer wiring harness for interconnecting elements of a complex electronic system.

The novel features which are believed to be characteristic of the invention, both as to its organization and method of operation, together with further objects and advantages thereof, will be better understood from the following description considered in connection with the accompanying drawings in which several embodiments of the invention are illustrated by way of example. It is to be expressly understood, however, that the drawings are for the purpose of illustration and description only and are not intended as a definition of the limits of the invention.

Figure 1:
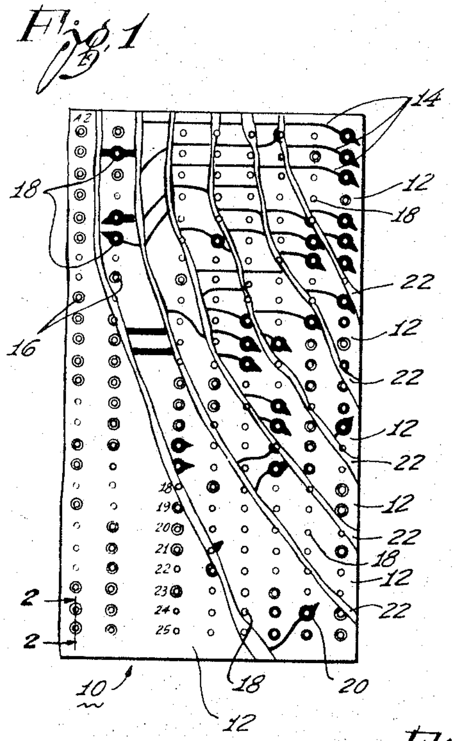
FIG. 1 is a top view partly broken away of a laminate according to the present invention.

With reference now to FIGS. 1 through 4, there is shown a typical laminate 10 according to the present invention which includes wiring for interconnecting various component carrying circuit cards for a complex electronic computer. The laminate 10 transmits signals representing information as well as applying predetermined voltages and currents to the active elements of the individual cards.

The typical laminate 10 includes a plurality of layers or individual laminas 12. The laminas 12 are prepared by any of the conventional techniques and each has a pattern of conductive metal members or wires 14 bonded thereto, the pattern determining the signal paths. One suitable technique is the photo etching of a predetermined pattern on a metallic clad, plastic "board" of epoxy glass cloth. One such board was 4 mil epoxy impregnated fiber glass cloth with a 2.7 mil or 2 oz. cladding of copper. The etching process removes predetermined areas of metal, leaving only the wiring pattern on the surface of the board.

Each of the individual wires 14 has two or more terminal pads 20 which provide a connecting area for a solder joint between a pin or lead (not shown) and the wire 14. Each lamina 12, except the lowermost, has one or more large apertures 16 punched out to provide access to the wires 14 of underlying laminas 12. Smaller apertures 18 are provided in all of the underlying laminas, each substantially in concentric, coaxial alignment with a large aperture 16, to provide an opening through which pins or leads may be inserted for subsequent soldering to a particular wire 14. Interconnections between laminas or layers may be accomplished either by plating through an aperture to create a conductive path from layer to layer, or by externally connecting terminals that are connected to different layers.

Each pad 20 is slightly larger than the access aperture 16 that overlies it. The several laminas 12 comprising the final stack are apertured at each location corresponding to a wire conductor. As will be readily understood, the small apertures 18 permit insertion of a conductor while the large apertures 16 provide acces to solder the conductor to the pad 20.

As is evident from FIG. 1, wires 14 on different levels will cross over one another but are insulated from each other by one or more of the intervening insulating lamina. It will also be evident that the wire paths must be carefully planned to avoid both the large apertures 16 and small apertures 18 except where a terminal pad 20 is to be exposed. The individual pads 20 are slightly larger than the access apertures and therefore are protected against lift off or peeling by the overlying lamina. Many soldering and unsoldering operations may be undertaken without damage to a pad.

Figure 5:
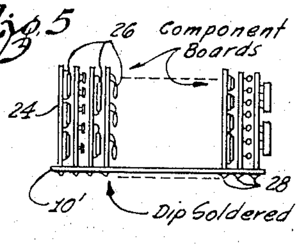
FIG. 5 is a side elevation view of a laminate to which a plurality of electronic component carrying boards have been attached.
Figure 3:
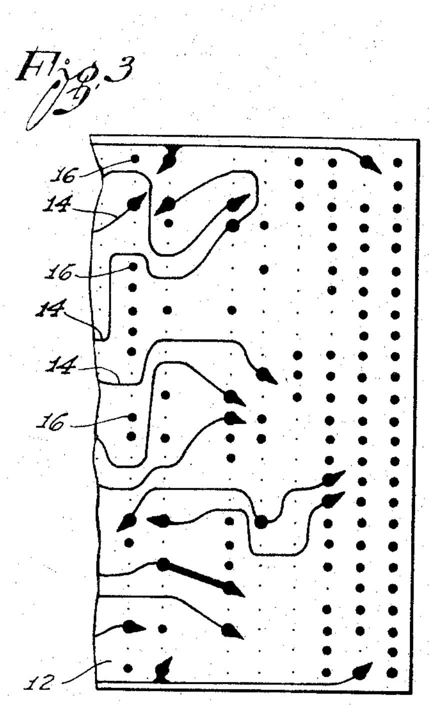
FIGS. 3 and 4 are plan views of portions of typical lamina which would be combined to form the laminate of FIGS. 1 and 2.

Turning next to FIG. 5, there is shown a typical laminate 10' according to the present invention upon which is mounted a plurality of component boards 24, each carrying a plurality of electronic components 26. The component boards 24 themselves may be multilayer laminates. In the embodiment of FIG. 5, each board 24 is provided at one end with a plurality of pins 28 which can be inserted into the smaller apertures 18. After all of the boards 24 have been inserted in the lamina 10', all of the connections can be made simultaneously by dip soldering all of the pins 28 to their respective pads 20.

Removal of the individual boards can be easily accomplished by melting the soldered connections and freeing the pins 28. It is convenient to use an air jet to blow melted solder away from the individual pins 28 thereby facilitating removal of the individual boards 24. Many circuit boards 24' can be replaced without damage to the laminate 10', thereby assuring continued usefulness and ease of maintenance.

Figure 6:
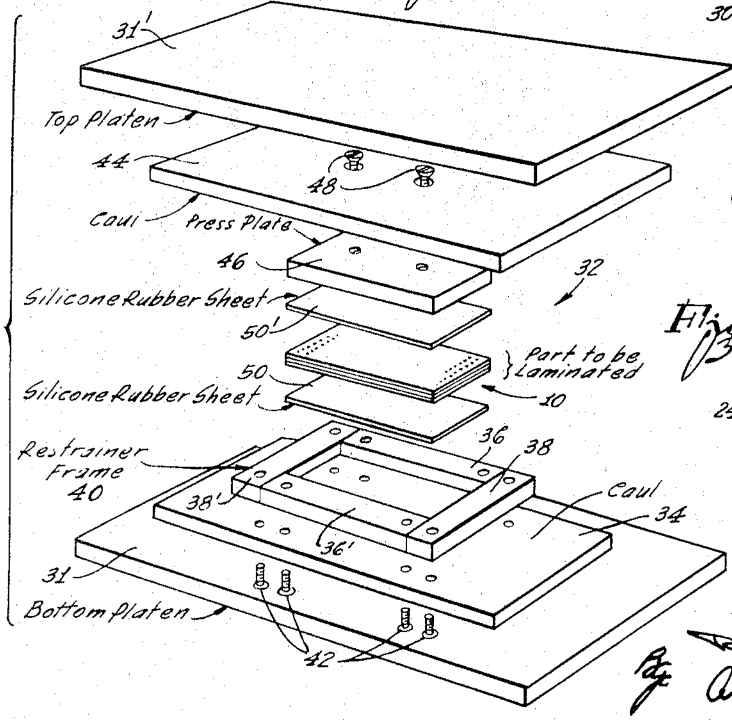
FIG. 6 is an exploded, isometric view of one form of compression mold for producing the laminate of FIGS. 1–4 above.

With reference now to FIG. 6, there is a diagrammatic representation of the press used to produce the laminate of FIGS. 1–5. The starting materials are described in connection with FIGS. 1–4, above. A thermosetting plastic board having a copper cladding bonded thereto is then etched by well known techniques to a desired pattern. In one embodiment of the invention, a 4 mil epoxy glass laminate was used which carried a two ounce or 2.7 mil plating of copper on one side of the sheet.

After etching the boards comprising the individual lamina 12 of the laminate 10, it is preferable to clean and roughen the unclad sides to remove a glaze or "butter coat" which results from the original lamination and cladding process and which might otherwise prevent a good bonding of the layers. A satisfactory method of cleaning is to sandblast carefully with a No. 80 grit aluminum oxide. After sandblasting, each layer should be cleaned by being wiped with a suitable pad dampened in acetone or trichloroethylene. If the laminas 12 are not to be used immediately, they should be stored in a clean, dry envelope to prevent contamination of the surfaces.

A sheet of a thermosetting adhesive film 22, is cut to the size of each lamina and is adhered to the back side thereof, just prior to laminating. The film may be a dry film phenolic such as is commercially available from the Permacel LePage Company, New Brunswick, N.J., under the name of Permacel P18, which is a phenol formaldehyde, thermosetting adhesive. Preferably, the film is approximately 2 mil thick. A similar adhesive is available in liquid form under the manufacturer's designation of Permacel 1824. Either acetone or methyl ethyl ketone applied to each of the corners of the board enables the film 22 to adhere with hand pressure.

After a layer is prepared with an adhesive film on the back, the larger apertures 16 are punched where necessary to provide clearance holes to subjacent pads 20 of the completed laminate 10. Other holes (not shown) for jig alignment and assembly may be placed along the outside borders to assist in the assembling process.

The individual laminas 12 are again wiped with acetone and the several layers 12 are placed in a fixture and stacked in the order that they will assume in the finished laminate 10. At this stage, all large apertures 16 can then be visually checked for alignment with the respective pads 20. Misaligned holes can be repunched if necessary. To protect the uppermost etched board, a cover layer of 4 mil glass cloth without cladding is prepared with and adhesive backing film 22 and is apertured to correspond to the top circuit layer and placed on the top of the stack. To prevent slipping during handling, the individual layers may be stapled together.

Figure 7:
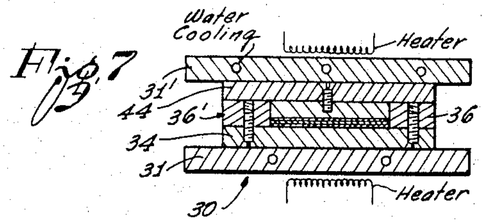
FIG. 7 is a sectional side elevation view of the assembled mold of FIG. 6.

Laminating is done in a press 30 having heated platens 31, 31' that can produce pressures up to 300 lb./sq. in. and temperatures to 375° F. Preferably, the platens 31, 31' are water cooled so that rapid reduction of temperature is feasible. A form of compression mold is placed in the press, and one embodiment of a compression mold 32, suitable for producing the laminate 10 of the present invention is shown in FIGS. 6 and 7. Improved configurations of the mold 32 will be immediately apparent to those skilled in the art and the present embodiment is merely illustrative although it does correspond to a device that is presently operable.

The female portion of the mold 32 includes a bottom caul 34 which serves as a base. Four rectangular bars 36, 36', 38, 38' are tapped to receive screws and form a restrainer frame 40. Screws 42 fasten the bars to the bottom caul 34. The male portion of the mold 32 includes an upper caul 44 and a press plate 46 which is also tapped to receive screws 48. The press plate 46 fits closely within the opening defined by the restrainer frame 40 and is thick enough to extend into the frame 40 during the laminating proceses.

A sheet of silicone rubber 50 is first placed in the cavity of the mold. The rubber sheet is approximately .125"±.02" thick and is preferably of a hardness of 60±5 on the "A" Shore durometer hardness scale. The stapled laminate is placed on the silicone rubber sheet 50 and a second rubber sheet 50' of substantially the same dimension and characteristics is placed over the laminate. The two parts of the mold are then placed together.

The platens 31, 31' are preheated to a temperature of 345°±5° F. and are applied to the cauls 34, 44 and the mold 32 to heat these elements without the application of pressure for approximately one minute. The press 30 should be opened to check alignment and release trapped vapors. The heated platens 31, 31' are again brought together and pressure is applied. For the laminate 10 of FIGURES 1–5, a pressure of 150±5 pounds per square inch is satisfactory. If the individual layers 12 contain many closely spaced clearance holes 16, it may be necessary to use a lesser pressure. The optimum pressure can be experimentally determined by starting with a pressure of approximately 50 pounds per square inch. If the laminate thus produced is unsatisfactory, then in subsequent trials, the pressure should be increased in increments of 25 pounds per square inch until a suitable laminate is formed without tear or excessive stretch of the individual layers.

During laminating, the heat and pressure are maintained for 30 minutes±5 minutes. At the expiration of this time, the platen heat is turned off and the platens 31, 31' are quickly cooled to room temperature at which time, the pressure is relieved and the mold is opened. The laminate 10 is then removed and can be visually inspected for defects. Defects, such as air pockets, appear as a lighter colored area within the normally translucent laminate. Incompletely bonded laminates may be reprocessed by reassembling the mold with the laminate rotated by a half turn in its own plane. For the second processing, the temperature should be maintained at 345° as before but the pressure should be increased by about 50 pounds per square inch over that used for the prior processing. The laminating time should not exceed 10 minutes. During laminating, the mold 30 should be examined from time to time. In the event that the silicone rubber is being extruded, the pressure should be relieved and the mold repositioned, before reapplying heat and pressure.

Figure 8:
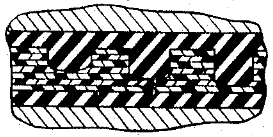
FIG. 8 is a sectional side elevation view of a laminate in place in the assembled compression mold during laminating.

As may be seen in FIGURE 8, the silicone rubber flows into the access apertures 16 during the laminating process. The rubber acts as a male die to prevent the adhesive film 12 from flowing into the aperture and in general, protects the exposed terminal pads 20 during lamination.

The finished laminate 10 is sheared to the desired length and width. The smaller apertures 18 are punched or drilled in the appropriate places and the laminate 10 is ready for use either for the direct insertion and interconnection of individual components or, for the interconnection of individual circuit boards each of which carries components in a circuit configuration. For example, a typical circuit board may contain a plurality of logical gates, bistable multivibrators, inverters, amplifiers, pulse transformers, and the like. A computer is comprised of many of these individual elements interconnected in a specific way to produce output signals that are a predetermined logical function of input signals.

Figure 9:
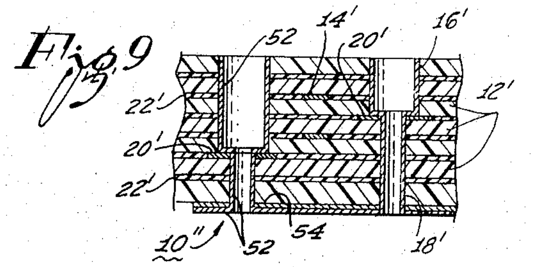
FIG. 9 is a side elevation sectional view of an alternative embodiment of a laminate according to the present invention.

In an alternative embodiment of the invention and with reference to FIG. 9, layer to layer interconnections are made possible by plating copper 52 from an exposed pad 20' on one lamina 12' through the smaller aperture 18', either to pads 20' on underlying lamina 12' or to an etched interconnecting pattern 54 on the bottom layer 12'. Inasmuch as the outer usrface of the bottom layer 12' is otherwise unused, this layer may be clad and etched into a suitable pattern 54 for interconnecting the plated through apertures.

The additional steps necessary to realize this alternative embodiment are entirely optional and may also include the utilization of a fully clad lamina for the bottom layer rather than adding an extra clad layer on the bottom, with the clad side facing downwardly. Copper cladding on both surfaces of a board is readily available, and circuit patterns can be etched into both surfaces.

All of the laminas 12' are prepared in accordance with the foregoing description. The unclad sides are cleaned and the adhesive film 22' is applied and the large apertures 16' are made. After laminating and drilling, the smaller apertures 18' are plated through. Although "plating through" techniques are well known in the art, essentially such a process includes the chemical deposition of copper 52 over the entire surface of the laminate 10'', including the inner surfaces of all of the apertures. Sufficient copper 52 is chemically deposited to permit electroplating of additional copper to a desired thickness. If circuit patterns are desired, a conventional circuit etching technique can be utilized.

A suitable deposition process uses products produced by the Shipley Company, Inc., having offices on Walnut St. in Wellesley, Mass., under the trademark "Cuposit." Other products are available under the trade names Sierra "KopperKold," distributed by The Wholesale Supply Co. of Los Angeles, Calif., and "Electroless Copper No. 305," distributed by Lectrokem, Inc. of South Gate, Calif. These processes are generally known as "copperizing" and provide a conductive copper surface which then can be built up by conventinoal electroplating techniques.

The unwanted copperizing is removed from the upper surface of the board by sanding or abrading, but the bottom surface and the apertures 16', 18' with their inner coating are permitted to retain the copper deposition. The laminated board 10'' is then electroplated to build up a thicker copper layer over the deposited copper, and, as a result, the bottom surface of the board may be considered as copper clad over the wiring pattern 14 that may be already there if the optional steps are taken.

The conventional protoengraving techniques which are used to provide the etched circuits may again be utilized on the bottom surface. A photo image, either positive or negative, indicates those areas which are to be retained as conductive circuits. One technique available is the addition of a photoresist covering the undesired areas and subjecting the board to a gold plating step. Alternatively, a resist may be placed over the desired areas and the remaining copper removed by an etchant. After gold plating, the board is placed in a conventional etching bath and copper is removed from all areas not gold plated. A typical etching solution might be ferric chloride, $FeCl_3$, which attacks copper but not gold.

Figure 2:
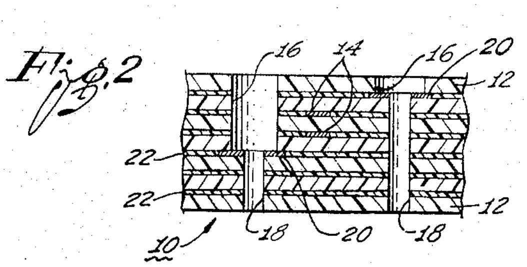
FIG. 2 is a cross sectional side elevation view of the laminate of FIG. 1 taken along lines 2—2 in the direction of the appended arrows.
Figure 10:
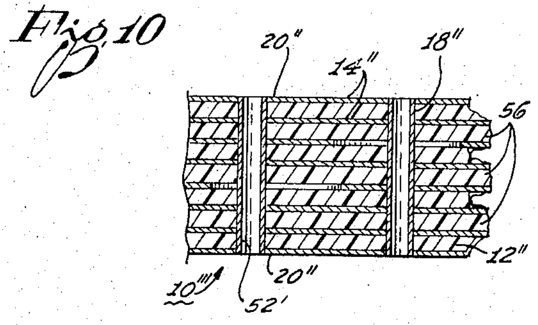
FIG. 10 is a sectional side elevation view of another alternative embodiment.
Figure 4:
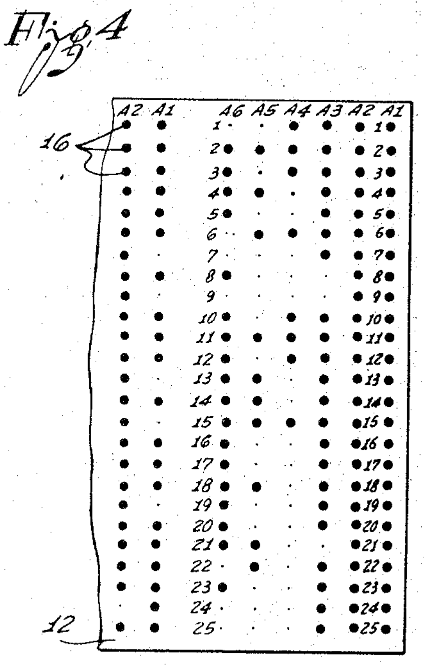

Still another embodiment of the present invention, illustrated in FIG. 10, is one in which a plurality of laminas are prepared without the large access apertures 16, 16' of the embodiment of FIGS. 2 and 9. A greater density of connection points can thus be achieved without sacrificing sturctural strength. In addition, both the upper and lower surfaces of the finished laminate 10''' are available for interconnections with wiring patterns etched on both surfaces. Moreover, by omitting the access apertures, more wiring area is available on each of the lamina and, the size of an individual terminal pad 20'' can be reduced.

It has been found desirable in this embodiment, to have the upper and lower surfaces of the finished laminate completely smooth and planar. That is, the irregular surface usually resulting from the preparation of laminates according to the preferred embodiment does not lend itself to optimum quality photographic etching processes. This design consideration, therefore, suggests a different choice of components comprising the finished laminate.

Preferably, individual lamina 12'', clad upon both surfaces are selected. In one embodiment, an 8 mil therosetting epoxy impregnated fiber glass board with 2 oz. or 2.7 mil copper cladding was used. Wiring patterns 14'' are etched upon both surfaces of the board. Unclad, "spacer" boards 56, which can be a thermosetting, dry, but only partially cured, epoxy glass board, in what is known in the art as the "B" stage, are placed between each of the laminas 12'' as an insulating and ahesive layer. A 13 mil board may be used as a spacer since the resins in the spacer boards 56 are only partially cured and flow to some extent under heat and pressure. During lamination, the wiring 14'' will become embedded in the spacer boards 56 and the surfaces of adjacent layers will be fused together.

An additional advantage of using boards cladded upon both surfaces is improved alignment and registration of noncoplanar circuits. With the photographic techniques normally used in the etching of the wiring patterns, it is possible to achieve much more accurate alignment of the circuits etched on a single board with less chance of misalignment in lamination. For example, in a six layer board, only three lamina, each carrying two circuits, must be accurately aligned, whereas six lamina must be accurately aligned if singly clad boards are used.

Obviously the circuits must be accurately aligned and in registry so that the apertures will only go through the desired terminal pads 20'' on the various layers and will not inadvertently encounter the other conductors 14'' of the etched wiring patterns. As the relative size of the pads 20'' and wires 14'' decreases, the margin for error is reduced and the punching or drilling operation becomes more critical.

The steps of this particular process include the etching of appropriate circuits on both surfaces of each of the fully clad boards. At the outer perimeter of each board, beyond the effective board area, tooling and registration holes are provided. An individual spacer board is then placed between adjacent etched boards and the stack is prepared for laminating. Inasmuch as there are no perforations or apertures in the circuit area of the individual lamina, the tooling and registration holes are essential for accurate alignment of the stack.

Figure 11:
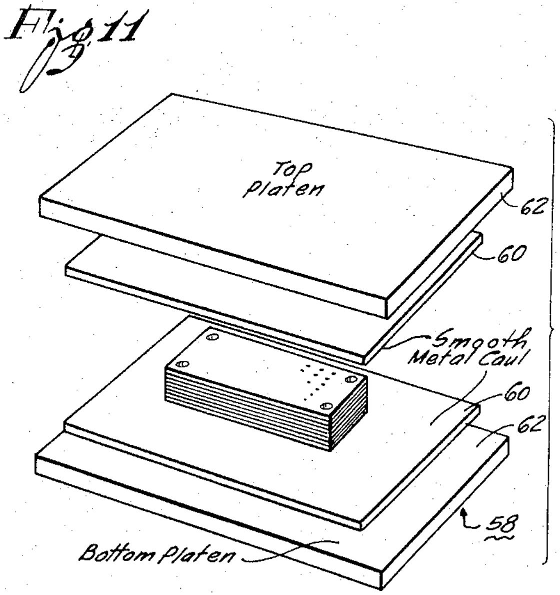
FIG. 11 is an exploded isometric view of a press structure for laminating the alternative embodiment of FIG. 10.

For this embodiment, the laminating press 58 may be of simpler construction, inasmuch as a water cooling capability is not required and a suitable press is diagrammed in FIG. 11. Moreover, a restraining fixture or compression mold is not used. Rather, completely smooth metal plates or cauls 60 are placed adjacent the stack to assure smooth planar surfaces on the outside of the finished laminate. The silicone rubber pads 50 may be used between the cauls 58 and the platens 62 of the press to assure a uniform transmission of pressure from the platens to the cauls. A stack to be laminated is therefore "sandwiched" between two smooth plates and "floated" in silicone rubber pads 50 between the platents. However, the use of the rubber pads is optional.

For the lamination process, the platens 62 are heated to a temperature of from 325° F. to 350° F. and the stack is subjected to heat and pressure for a period of from 15 to 20 minutes. Because the layers 12'' are not perforated or apertured, the amount of applied pressure is not nearly so critical as with the preferred embodiment. A pressure of 150 pounds per square inch produces a generally satisfactory laminate although different materials and thicknesses may require greater or lesser pressures. However, one skilled in the art can easily ascertain the optimum pressure for any combination of lamina 12 and spacer boards 56.

After laminating, the finished board can be inspected visually to determine the presence of any defects in lamination. As with the prefered embodiment, defects will show up as opaque areas in an otherwise translucent board. It will also be noted that the circuits 14″ etched into the upper and lower surfaces become embedded in the laminate and as a result, appear to be perfectly flush with the surface. If a laminate has no defects, the smaller apertures 18″ are drilled or punched through all of the terminal pads 20″. Where noncoplanar circuits are to be interconnected, the apertures 18″ will intersect terminal pads 20″ that are in vertical alignment. The laminate is then copperized and metallic copper 52′ is chemically deposited upon all of the surfaces as in the alternative embodiment above. After the chemical deposition, an additional thickness of copper is added through conventional electroplating techniques, plating through the apertures and covering the flushed circuits on upper and lower surfaces. The outer surfaces may then be cleaned of excess copper by chemical or mechanical means or, alternatively, an identical wiring pattern can be superimposed over the existing circuit and the excess copper etched away using standard techniques.

Figure 12:
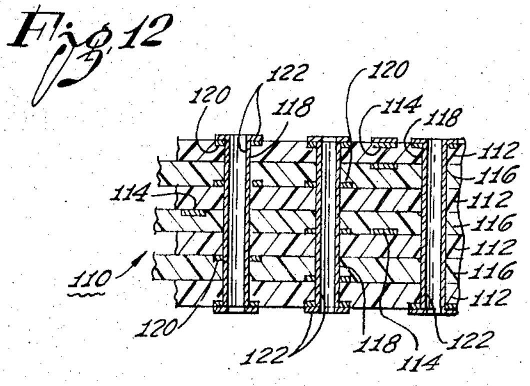
FIG. 12 is a sectional side elevation view of a laminate similar to that of FIG. 10 but with a surface wiring pattern plated over the embedded circuits.

With reference now to FIG. 12, there is shown in cross section a portion of a laminate prepared with plated-through apertures and with a plated "buildup" of the exterior surface wiring patterns. As seen in FIG. 12, a laminate 110 is comprised of alternate layers of doubly clad laminas 112, each carrying etched wiring patterns 114 on both surfaces, and unclad spacer boards 116.

The etched wiring 114 on the external surfaces of the outermost lamina 112 is "flushed" into the surface as a result of the lamination process. The etched wiring patterns 114 on the inner surfaces, however, are embedded in surfaces of the relatively softer, unclad spacer boards 116. As a result, the laminate 110 is an integral cohesive structure with no pockets or voids. After laminating, insertion apertures 118 are made to intersect terminal pads 120 of the several wiring patterns 114.

The "copperizing" process chemically deposits a conductive layer of copper 122 over all of the exposed surfaces, including the interior surfaces of the insertion apertures 118. Additional copper is then electroplated onto the laminate to build up the copper coating. Although the exact nature of the interface between the metallic copper terminal pad 120, and the chemically deposited copper, and the electroplated copper is not precisely known, a photomicrograph of an intersection at a 1000× magnification seems to show a remarkably homogeneous cross section. It may be safely assumed, therefore, that the electrical connection between the terminal pads 120 and the added copper 122 is a reliable one.

In preference to sanding, abrading or etching all of the copper from the entire external surfaces, it has been found desirable to etch a wiring pattern on the surfaces that is identical to the pattern that has been inlaid previously into the surfaces, and this is readily accomplished, using well known techniques. To protect the copper plating within the apertures 118 and the surface wiring pattern, it is preferable to photoetch the pattern and flash on a gold plate over the areas to be preserved. A chemical etchant such as $FeCl_3$ can then be used to remove the excess copper. The finished laminate 110, as shown in FIG. 12, has a wiring pattern embedded in the surface with a copper buildup 122 protruding above the surface.

Components or circuit boards can be connected to this laminate in the same way as with the other embodiments. The individual pins or wire conductors are inserted in the apertures from either side and soldered to the appropriate terminal pad of the laminate. It will be obvious that laminates according to the present invention can be used to support individual components and that still other laminates can be used for interconnecting them. The use of thermosetting resins in combination with the fibrous matter provides a high degree of stability and structural strength. Furthermore, the individual etched wiring circuits are not subject to flow or variation in relative positioning and problems of registry and alignment are made inconsequential. Accordingly, the scope of the invention is to be limited only by the scope of the appended claims.

What is claimed is:

1. In a method for producing laminated circuit boards, the steps of:

applying to at least one surface of each of a number of substantially cured thermosetting plastic laminas a plurality of conductors having enlarged portions forming terminal pads at predetermined locations;

securing to the opposite surface of each lamina a sheet of substantially noncured thermosetting plastic for interposition between each pair of adjacent laminas;

making first, larger apertures through some of said laminas and the sheets secured thereto at locations corresponding to those of said pads on another of said laminas;

forming a stack by aligning said some laminas and sheets, with said first apertures in registry with said pads and adding the remaining laminas and sheets so that said first apertures form access apertures extending from one surface of the stack to said terminal pads, said pads forming the bottom of an access aperture;

bonding said laminas to one another by means of said interposed sheets and application of heat and pressure to form a laminated structure having conductors and terminal pads embedded at different levels of depth, with an access aperture connecting the pads with one outer surface of the structure; and subsequently forming a smaller continuing second aperture through said pads and the remaining bonded laminas to thereby produce an opening through the pad which interconnects the two external surfaces of the finished laminated circuit board.

2. In a method for producing laminated circuit boards, the steps of:

applying to at least one surface of each of a number of substantially cured thermosetting plastic laminas a plurality of conductors having enlarged portions forming terminal pads at predetermined locations;

securing to the opposite surface of each lamina a sheet of substantially noncured thermosetting plastic for interposition between each pair of adjacent laminas;

making first, larger apertures through some of said laminas and the sheets secured thereto at locations corresponding to those of said pads on another of said laminas;

forming a stack by aligning said some laminas and sheets with said first apertures in registry with said pads and adding the remaining laminas and sheets so that said first apertures form access apertures extending from one surface of the stack to said terminal pads, said pads forming the bottom of an access aperture;

enclosing said stack in a compression mold fixture with at least one elastomeric sheet between the fixture and the stack surface which includes the access apertures;

applying elevated temperature and pressure to said mold for bonding said laminas to one another with the softened elastomeric sheet material flowing into the access apertures to prevent the noncured thermosetting sheet material from entering said apertures, thereby forming a laminated structure having conductors and terminal pads embedded at differentt levels of depth, with an access aperture connecting the pads with one outer surface of the structure; and subsequently forming a smaller continuing second aperture through said pads and the remaining thickness of the laminated structure to thereby produce an opening through the pad which interconnects the two external surfaces of the finished laminated circuit board.

3. A method according to claim 2, in which said elastomeric sheet is a silicone rubber sheet.

4. A method according to claim 1, in which the first apertures forming the access apertures are made to have a diameter slightly smaller than that of the pads.

References Cited

UNITED STATES PATENTS

| | | | |
|---|---|---|---|
| 2,876,393 | 3/1959 | Tally | 29—155.5 X |
| 3,107,414 | 10/1963 | Sterling | 29—155.5 |
| 3,228,091 | 1/1966 | Rice | 29—155.5 |

WILLIAM I. BROOKS, *Primary Examiner.*